(12) United States Patent
Lin

(10) Patent No.: US 7,126,061 B2
(45) Date of Patent: Oct. 24, 2006

(54) PRINTED CIRCUIT BOARD FOR AVOIDING PRODUCING CUTTING BURRS

(75) Inventor: Yung-Jen Lin, Taipei (TW)

(73) Assignee: Lite-On Technology Corporation, Taipei (TW)

( * ) Notice: Subject to any disclaimer, the term of this patent is extended or adjusted under 35 U.S.C. 154(b) by 92 days.

(21) Appl. No.: 10/861,455

(22) Filed: Jun. 7, 2004

(65) Prior Publication Data

US 2005/0072596 A1    Apr. 7, 2005

(30) Foreign Application Priority Data

Oct. 7, 2003    (TW) .............................. 92127798 A

(51) Int. Cl.
*H05K 1/16* (2006.01)
(52) U.S. Cl. ...................................... 174/260; 174/262
(58) Field of Classification Search ............... 174/250, 174/255, 262, 260, 261, 266, 52.4; 257/698; 361/808, 760, 764, 767
See application file for complete search history.

(56) References Cited

U.S. PATENT DOCUMENTS

| | | | | |
|---|---|---|---|---|
| 6,057,027 A | * | 5/2000 | Roy | 428/209 |
| 6,263,565 B1 | * | 7/2001 | Gotoh et al. | 29/852 |
| 6,625,036 B1 | * | 9/2003 | Horio | 361/760 |
| 6,798,665 B1 | * | 9/2004 | Kimura | 361/736 |
| 6,998,647 B1 | * | 2/2006 | Morimoto et al. | 257/99 |

* cited by examiner

*Primary Examiner*—Ishwar Patel
(74) *Attorney, Agent, or Firm*—Birch, Stewart, Kolasch and Birch, LLP

(57) ABSTRACT

A printed circuit board for avoiding producing burrs, the printed circuit board includes a packaging substrate, at least one plated through hole, at least one first conductive portion, at least one non-conductive portion, at least one second conductive portion and at least one cut section. The plated through hole is formed on the packaging substrate. The first conductive portion and the second conductive portion respectively are adjacent to two sides of a peripheral of the plated through hole and separated by the non-conductive portion. Furthermore, the cut section is arranged on the non-conductive portion, thus the packaging substrate is cut without passing through the first conductive portion, and it will not cause the burrs on the first conductive portion.

7 Claims, 4 Drawing Sheets

PRINTED CIRCUIT BOARD FOR AVOIDING PRODUCING CUTTING BURRS

BACKGROUND OF THE INVENTION

This Nonprovisional application claims priority under 35 U.S.C. § 119(a) on patent application Ser. No(s). 92127798 filed in TAWIAN on Oct. 7, 2003, the entire contents of which are hereby incorporated by reference.

1. Field of the Invention

The present invention relates to a printed circuit board, and more particularly to a printed circuit board for avoiding producing cutting burrs after a cutting process.

2. Description of the Related Art

Referring to FIGS. 1 and 2, the prior art provides a fabricating process of an infrared data association (IRDA) device 1a. The fabricating process comprises packaging a plurality of chips on a printed circuit board 10a and forming a plurality of infrared data association device 1a by cutting the printed circuit board 10a. Then, the IRDA devices 1a is attached to electronic equipment by using the SMT (surface mounting technology) for signal transmission.

Referring to FIG. 2, the prior art provides a printed circuit board 10a which comprises a substrate 11a, a plurality of plated-through holes 12a formed on the substrate 11a and bonding pads 13a electrically connected to the corresponding plated-through holes 12a for forming a packaging mounting feet. Then, the printed circuit board 10a is cut along an arranged direction of the plated-through holes 12a, and the plated through holes 12a and the bonding pads 13a are cut at the same time to form the packaging mounting feet. Furthermore, the signal transmission chips can be packaged on the substrate 11a by the packaging mounting feet and the substrate 11a is welded on a printed circuit board of electronic equipment.

However, the conventional printed circuit board still has some defects like cutting burrs. When the printed circuit board is cut, the cutting burrs will cause a short circuit on the bonding pads 13a and affect the SMT process. Espectially, when the bonding pads 13a are getting smaller and smaller according to micro electronic equipment, the cutting burrs are all the more serious. Therefore, the conventional printed circuit board has a problem in failing to eliminate burrs, thereby bringing about a waste of manpower and raising costs.

SUMMARY OF THE INVENTION

The first object of the present invention is to provide a printed circuit board for avoiding producing cutting burrs. After the printed circuit board is cut, the cutting burrs of a conductive portion of the printed circuit board will be eliminated without using manpower for saving the cost.

The second object of the present invention is to provide a printed circuit board for avoiding producing cutting burrs, so as to produce the product by automation, and to reduce defective rate.

To achieve the above objects, the present invention provides a printed circuit board for avoiding producing cutting burrs, to be used in packaging board. The printed circuit board includes a packaging substrate and a plurality of bonding pad units. Each of bonding pad units includes a plated through hole, a first conductive portion, a non-conductive portion and a cutting region. The plated through hole is formed on the packaging substrate. The first conductive portion is arranged on the packaging substrate and adjacent to part of the periphery of the plated through hole. The non-conductive portion is arranged on the packaging substrate and adjacent to the first conductive portion, and the non-conductive portion traverses two sides of the plated through hole. The cutting region is defined within the non-conductive portion. Thus, the printed circuit board can avoid producing cutting burrs in the first conductive portion when the printed circuit board is cut.

To provide a further understanding of the invention, the following detailed description illustrates embodiments and examples of the invention, this detailed description being provided only for illustration of the invention.

BRIEF DESCRIPTION OF THE DRAWINGS

The drawings included herein provide a further understanding of the invention. A brief introduction of the drawings is as follows.

DETAILED DESCRIPTION OF THE EMBODIMENTS

Figure 1:
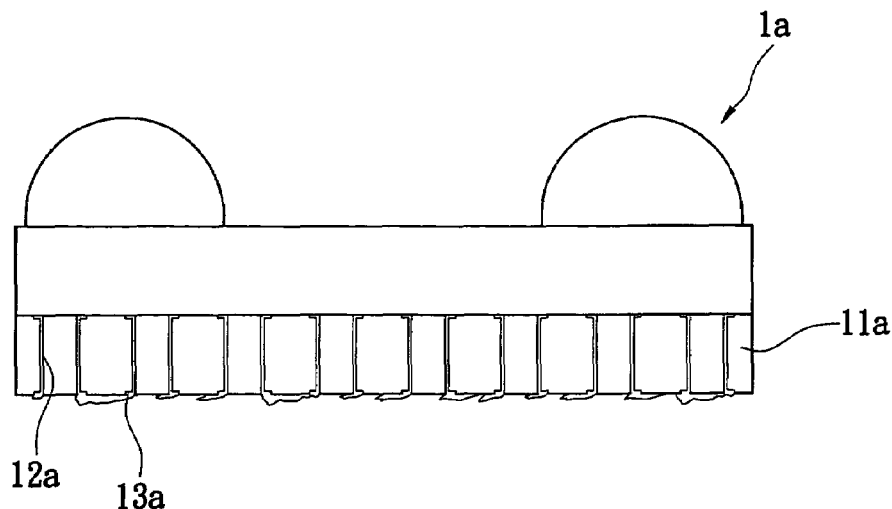
FIG. 1 is a front view of an infrared data association device with a printed circuit board having cutting burrs according to the prior art.
Figure 2:
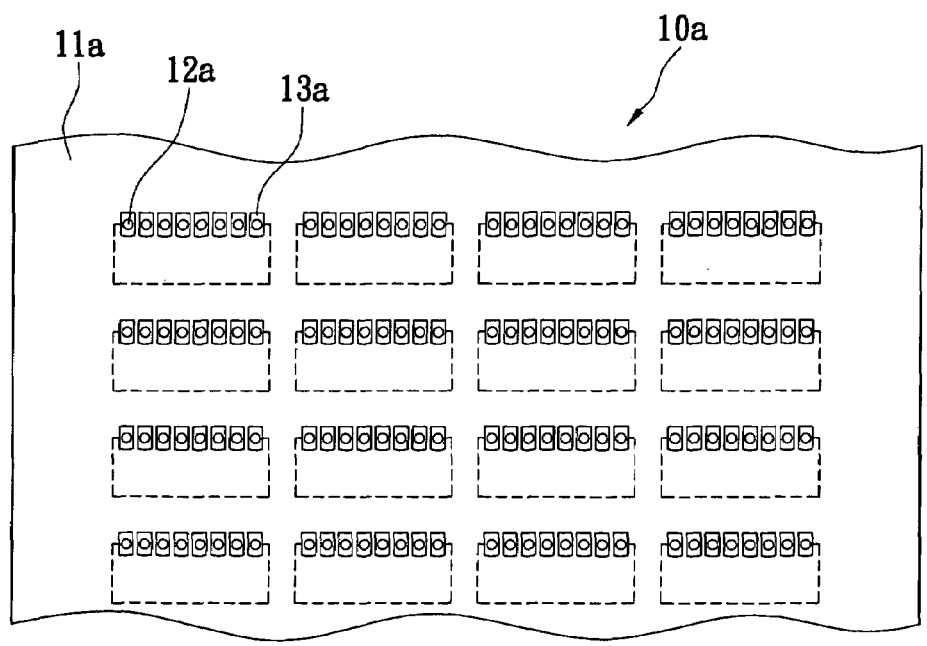
FIG. 2 is a bottom view of the printed circuit board of the prior art.

Wherever possible in the following description, like reference numerals will refer to like elements and parts unless otherwise illustrated.

Referring to FIGS. 3 to 6, the present invention provides a printed circuit board for avoiding producing cutting burrs to be used in packaging board. The printed circuit board includes a packaging substrate 10 and a plurality of bonding pad units. Each of the bonding pad units includes a plated through hole 11, a first conductive portion 12, a non-conductive portion 13, a second conductive portion 14 and a cutting region 15. Each of the bonding pad units is arranged on the packaging substrate 10. The plated through hole 11 is formed in the packaging substrate 10. The first conductive portion 12 and the second conductive portion 14 are connected to two opposite ends of the partial peripheral of the plated through hole 11, respectively. The non-conductive portion 13 is arranged on the packaging substrate 10 and traverses two sides of the plated through hole 11. The first conductive portion 12 and the second conductive portion 13 are divided by the non-conductive portion 13. The cutting region 15 is defined within the non-conductive portion 13. Thus, the packaging substrate 10 is cut along the cutting region 15 to prevent the first conductive portion 12 from being cut and the first conductive portion 12 from causing the cutting burrs. Therefore, the packaging substrate 10 is mounted on the other device without causing a short circuit, because there are no burrs on the first conductive portion 12.

Figure 3:
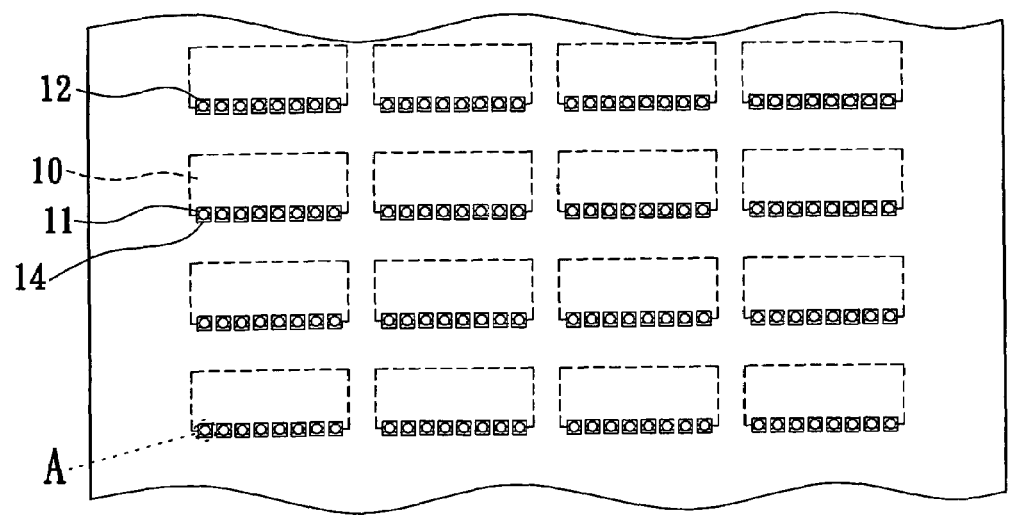
FIG. 3 is a bottom view of a printed circuit board of the present invention.
Figure 4:
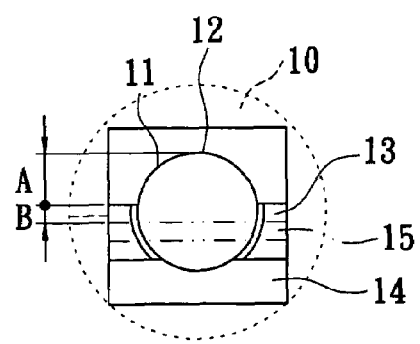
FIG. 4 is an enlarged view of area "A" of FIG. 3 of the printed circuit board of the present invention.
Figure 5:
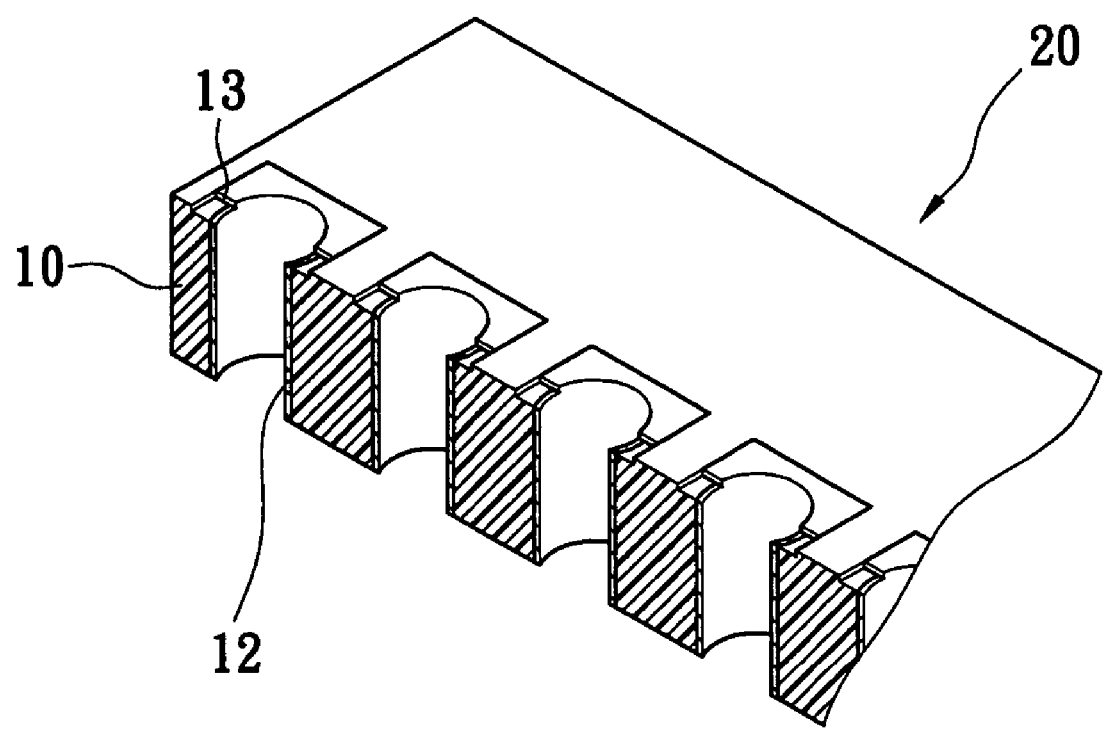
FIG. 5 is a partial cross-sectional view of the packaging substrate of the present invention.
Figure 6:
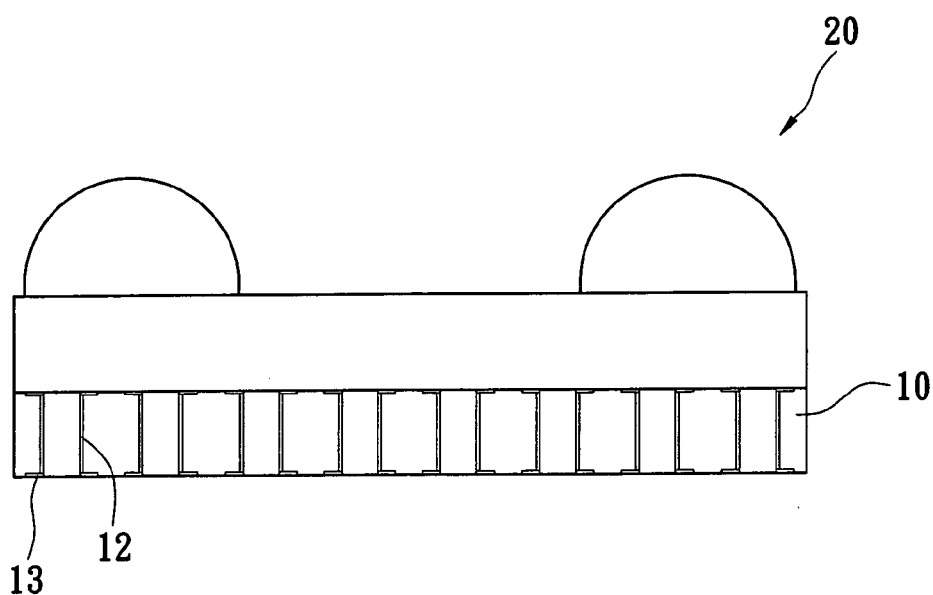
FIG. 6 is a front view of an infrared data association device with printed circuit board without cutting burrs of the present invention.

Referring now to FIGS. 3 to 5, the printed circuit board includes a plurality of sets of packaging substrates 10 and a plurality of bonding pad units alignedly arranged on each set of packaging substrate 10. The plated through hole 11 of the bonding pad unit is defined on the packaging substrate 10. The first conductive portion 12 and the second conductive portion 14 are formed as a conductive pad and positioned on the same side of the packaging substrate 10. Both the first conductive portion 12 and the second conductive portion 14 are disposed on opposite sides of part of the periphery. The first conductive portion 12 is positioned on an inside of the packaging substrate 10, and the second conductive portion 14 is positioned on an outside of the periphery of the packaging substrate 10. The non-conductive portion 13 is etched as an indentation (shown in FIG. 5) on one side of the packaging substrate 10 and aligned with one another, and the non-conductive portion 13 traverses two sides of the plated through hole 11 to divide the first conductive portion 12 and the second conductive portion 14. The cutting region 15 is defined within the non-conductive portion 13. The cutting region 15 has a width which is smaller than that of the non-conductive portion 13, and the non-conductive portion 13 is non-coplanar with respect to the first conductive portion 12 and the second conductive portion 14 (shown in FIG. 5).

Referring to FIG. 4, the first conductive portion 12 has an edge line parallel to a tangent line of the plated through hole 11, and a perpendicular distance "A" from the edge line of the conductive portion 12 to the tangent line is between about 0.05 mm and 0.2 mm, and a perpendicular distance "B" from the edge line of the first conductive portion 12 to an edge line of the cutting region 15 is between about 0 mm and 0.01 mm.

Furthermore, referring to FIGS. 3 to 6, the package substrates 10 of the printed circuit board is packaged on the infrared data association (IRDA) chips, and the printed circuit board is cut along the cutting regions 15 through the plated through holes 11 to form a package 20 with a plurality of semi-plated through holes. The semi-plated through holes and the first conductive portions 12 are formed as mounting feet of the package 20. The cutting regions 15 are defined within the non-conductive portion 13, so that the packaging substrate 10 is cut along the non-conductive portion 13. Therefore, the packaging substrate 10 will not be cut along the first conductive portions 12, and cutting burrs are not formed on an edge of the first conductive portion 12. The mounting feet of the package 20 consist of the first conductive portions 12 and the semi-plated through holes 11 mounted on the other device, so the short circuit problem will not occur.

To sum up, the present invention provides a printed circuit board for avoiding producing cutting burrs, which will resolve a problem in the burrs elimination, and can prevent the manpower from being wasted and the cost from being increased.

There has thus been described a new, novel and heretofore unobvious printed circuit board which eliminates the aforesaid problem in the prior art. Furthermore, those skilled in the art will readily appreciate that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A printed circuit board for avoiding producing cutting burrs, comprising:
    an infrared data association chip;
    a packaging substrate packaging the infrared data association chip thereon; and
    a plurality of bonding pad units alignedly arranged on the packaging substrate and aligned with one side of the infrared data association chip, each of the bonding pad units comprising:
    a plated through hole formed in the packaging substrate, the plated through hole is plated with a conductive material on an inner wall defining the plated through hole;
    a conductive pad including:
        a first conductive portion arranged on a top surface of the packaging substrate to surround substantially an upper semicircular circumference of the plated through hole, and
        a second conductive portion arranged on the top surface of the packaging substrate to surround substantially a lower portion of a lower semicircular circumference of the plated through hole;
    a non-conductive portion arranged on the packaging substrate, the non-conductive portion being recessed from the top surface of the packaging substrate, the non-conductive portion being along substantially an upper portion of the lower semicircular circumference of the plated through hole, the non-conductive portion traversing two sides of the plated through hole, the non-conductive portion and the second conductive portion surrounding substantially the lower semicircular circumference of the plated through hole; and
    a cutting region defined within the non-conductive portion for cutting such that the conductive pad surrounding substantially the upper semicircular circumference of the plated through hole is free of burrs.

2. The printed circuit board of claim 1, wherein the first conductive portion and the second conductive portion are divided by the non-conductive portion.

3. The printed circuit board of claim 2, wherein non-conductive portion is non-coplanar with respect to the first conductive portion and the second conductive portion.

4. The printed circuit board of claim 1, wherein the non-conductive portions are aligned with one another.

5. The printed circuit board of claim 1, wherein the plated through holes are aligned with one another.

6. The printed circuit board of claim 1, wherein the first conductive portion has an edge line parallel to a tangent line in tangency with the plated through hole, and a perpendicular distance from the edge line of the first conductive portion to the tangent line is between about 0.05 mm and 0.2 mm.

7. The printed circuit board of claim 1, wherein a perpendicular distance from the edge line of the first conductive portion to an edge line of the cutting region is between about 0 mm and 0.01 mm.

* * * * *